US008114576B2

(12) United States Patent
Morris

(10) Patent No.: US 8,114,576 B2
(45) Date of Patent: Feb. 14, 2012

(54) METHOD FOR FABRICATING ELECTRICAL CIRCUITRY ON ULTRA-THIN PLASTIC FILMS

(75) Inventor: Francis J. Morris, Dallas, TX (US)

(73) Assignee: Raytheon Company, Waltham, MA (US)

( * ) Notice: Subject to any disclaimer, the term of this patent is extended or adjusted under 35 U.S.C. 154(b) by 983 days.

(21) Appl. No.: 12/040,406

(22) Filed: Feb. 29, 2008

(65) Prior Publication Data

US 2008/0213678 A1 Sep. 4, 2008

Related U.S. Application Data

(60) Provisional application No. 60/892,678, filed on Mar. 2, 2007.

(51) Int. Cl.
*G03F 7/26* (2006.01)

(52) U.S. Cl. ........................................ 430/311; 430/330

(58) Field of Classification Search .................. 430/311, 430/330

See application file for complete search history.

(56) References Cited

U.S. PATENT DOCUMENTS

| | | | | |
|---|---|---|---|---|
| 3,691,140 | A | 9/1972 | Silver | |
| 4,288,282 | A | 9/1981 | Brown et al. | 156/630 |
| 6,309,805 | B1 | 10/2001 | Carpenter | 430/322 |
| 2006/0287467 | A1 | 12/2006 | Hwang | |

FOREIGN PATENT DOCUMENTS

| | | | |
|---|---|---|---|
| EP | 0 442 674 | A | 8/1991 |
| EP | 0 961 533 | A2 | 12/1999 |
| GB | 2 030 779 | A | 4/1980 |
| WO | WO 98/52391 | | 11/1998 |

OTHER PUBLICATIONS

European Patent Office, "Communication Pursuant to Article 94(3) EPC," mailed Feb. 15, 2010, regarding Application No. 08 754 836. 8-1235, (6 pages).

Notification of Transmittal of the International Search Report and the Written Opinion of the International Searching Authority, or the Declaration; International Application No. PCT/US2008/055450, Mailed Jul. 14, 2008.

European Patent Office, "Summons to attend oral proceedings pursuant to Rule 115(1)EPC," mailed Jul. 12, 2011, regarding Application No. 08 754 836.8-1235/2127506, (5 pages).

*Primary Examiner* — Kathleen Duda

(74) *Attorney, Agent, or Firm* — Cantor Colburn LLP

(57) ABSTRACT

In accordance with the teachings of one embodiment of the present disclosure, a method of forming high-density metal interconnects on flexible, thin-film plastic includes laminating a dry photoresist layer to a substrate. The photoresist-laminated substrate is baked. An assembly is formed by laminating a plastic film to the baked, photoresist-laminated substrate. One or more electrically conductive interconnect layers are processed on a first surface of the laminated plastic film. The processing of the one or more electrically conductive interconnects includes photolithography. The assembly is baked and soaked in a liquid. The processed plastic film is then separated from the substrate.

17 Claims, 2 Drawing Sheets

METHOD FOR FABRICATING ELECTRICAL CIRCUITRY ON ULTRA-THIN PLASTIC FILMS

CROSS REFERENCE TO RELATED APPLICATIONS

This application claims the benefit of priority under 35 U.S.C. §119(e) of U.S. Provisional Patent Application Ser. No. 60/892,678 entitled "Method for Fabricating Interconnect on Ultra Thin Plastic," which was filed on Mar. 2, 2007.

GOVERNMENT FUNDING

This invention was made with Government support under Contract No. F33615-99-C-1513 awarded by the United States Army. The Government may have certain rights in the invention.

TECHNICAL FIELD

This disclosure relates in general to electronics, and more particularly to forming electrical circuitry on ultra-thin plastic films.

BACKGROUND

Photolithography (also optical lithography) is a process used in semiconductor microfabrication to selectively remove parts of a thin film or the bulk of a substrate. Photolithography typically uses light to transfer a geometric pattern from a photomask to a light-sensitive photoresist on substrate. A series of chemical treatments then engraves the exposure pattern into the material underneath the photoresist. In some complex integrated circuits, such as modern Complementary metal-oxides semiconductor (CMOS), a semiconductor wafer will go through the photolithographic cycle as many as fifty times. Using photolithography to form high-density patterns often requires particularized surfaces, such as extremely flat surfaces that are insensitive to elevated temperatures, due to process requirements and tolerance constraints.

SUMMARY

In accordance with the teachings of one embodiment of the present disclosure, a method of forming high-density metal interconnects on flexible, thin-film plastic includes laminating a dry photoresist layer to a substrate. The photoresist-laminated substrate is baked. An assembly is formed by laminating a plastic film to the baked, photoresist-laminated substrate. One or more electrically conductive interconnect layers are processed on a first surface of the laminated plastic film. The processing of the one or more electrically conductive interconnects includes photolithography. The assembly is baked and soaked in a liquid. The processed plastic film is then separated from the substrate.

Some embodiments of the present disclosure may enable the fabrication of sophisticated electronic circuitry on transparent, plastic films having a thickness within the ranges of 10 to 500 microns; however, the plastic films may have any suitable thickness. In addition, the circuitry formed on the plastic film of some embodiments may have widths within the 5 to 50 micron range, though any suitable width may be used. Some embodiments may provide multi-layer interconnects, including, for example, interconnected circuitry on both sides of a thin plastic film. In some embodiments, the circuitry may be able to perform particular functions, such as, for example, transmitting signals. In addition, in some embodiments the electronic circuitry may be invisible to the naked eye and thus a fully processed plastic film may appear substantially transparent.

Other technical advantages of the present disclosure will be readily apparent to one skilled in the art from the following figures, descriptions, and claims. Moreover, while specific advantages have been enumerated above, various embodiments may include all, some, or none of the enumerated advantages.

BRIEF DESCRIPTION OF THE DRAWINGS

For a more complete understanding of the present disclosure and its advantages, reference is now made to the following description, taken in conjunction with the accompanying drawings, in which.

DETAILED DESCRIPTION

The present disclosure provides example methods for fabricating high-density electronic circuitry on ultra-thin plastic films. In general, certain methods include the following acts: (i) an ultra-thin plastic film is laminated to a substrate; (ii) high-density circuitry is micro-fabricated on a surface of the plastic film using photolithography, metal depositions, and etching; and (iii) the plastic film is separated from the substrate. The example embodiments of the present disclosure are best understood by referring to FIGS. 1A through 2 of the drawings, like numerals being used for like and corresponding parts of the various drawings.

Figure 1A:
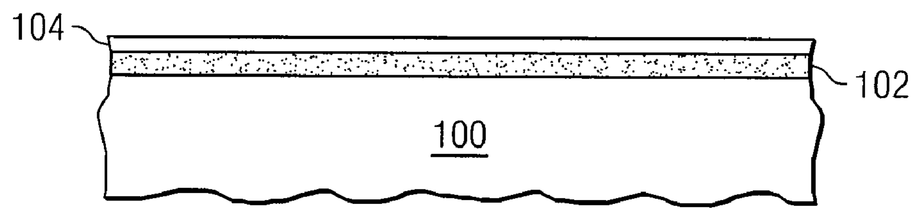
FIG. 1A shows a cross-sectional view of a portion of a substrate after the application of an adhesive to an outer surface of the substrate according to one embodiment.

FIG. 1A shows a cross-sectional view of a portion of a substrate 100 after the application of an adhesive 102 to an outer surface of the substrate 100 according to one embodiment. Substrate 100 generally refers to any surface that enables the fabrication of electronic circuitry on ultra-thin plastic films coupled to the substrate 100 surface. Substrate 100 may be formed from any suitable material and may have any suitable dimensions. For example, substrate 100 may be an oxidized silicon wafer with a 150 millimeter diameter or a square 12×12 inch glass substrate. In various embodiments, substrate 100 may be larger or smaller depending on the particular application and/or the capabilities of subsequent processing.

Adhesive 102 generally refers to any material capable of bonding, at least temporarily, a plastic film to substrate 100. In this example, adhesive 102 is a dry photoresist film that may be laminated to substrate 100. One example of such a film is the Riston® FX900 Series photoresist film made by Dupont. Dry photoresist films often include a protective cover 104, such as a Mylar film, designed to shield the underlying photoresist film from exposure to light or the elements. As explained further below, the protective cover 104 may itself provide a suitable plastic surface for subsequent circuitry processing, thereby simplifying the process flow of certain embodiments. The limited transparency level of some protective covers 104, however, is not suitable for some applications. In this example, protective cover 104 is removed in preparation for further processing.

Although this example uses a laminated photoresist film 102 to bond plastic film to substrate 100, any suitable adhesive 102 or other suitable bonding force may be used. For example, in some alternative embodiments static electricity may sufficiently bond a thin plastic film to substrate 100. In some other alternative embodiments, a spray-on or spin-on photoresist or a spin-on epoxy may be used in place of photoresist film 102. Some types of spray-on photoresist may assure that plastic films, such as polyethylene, can be easily removed without additional stretching of the plastic film.

In this example, the photoresist-laminated substrate 100 is heated in an oven after protective cover 104 is removed. The oven bake generally removes some of the solvents in the exposed photoresist film 102 that might otherwise outgas and warp the photoresist surface. Suitable bake parameters for this example include exposure to a temperature range of 90 C to 150 C for approximately ten minutes; however, any suitable bake parameters may be used. An ultra-thin plastic film is then applied to the substrate, as described further with reference to FIG. 1B.

Figure 1B:
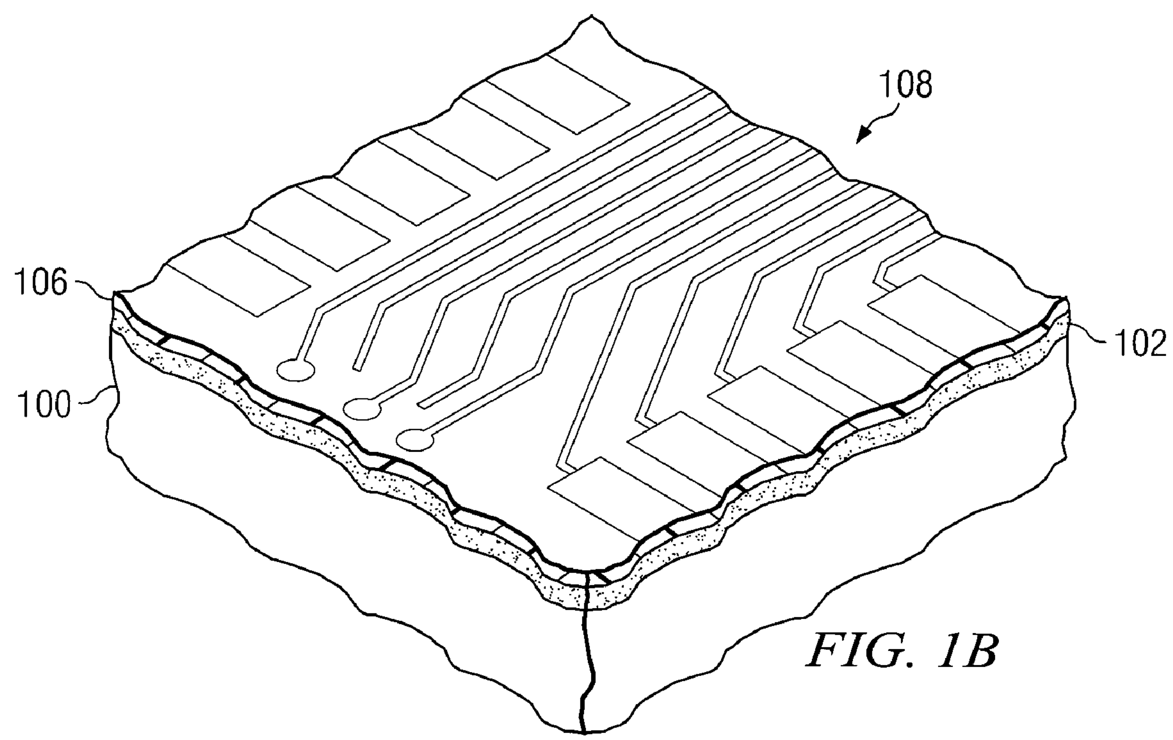
FIG. 1B shows a perspective view of a portion of the substrate of FIG. 1A after the adhesive has bonded a plastic film to the substrate and after the formation of electronic circuitry on a surface of the plastic film.

FIG. 1B shows a perspective view of a portion of the substrate 100 of FIG. 1A after adhesive 102 has bonded a plastic film 106 to the substrate 100 and after the formation of electronic circuitry 108 on a surface of plastic film 106. Plastic film 106 generally refers to any plastic material that may be bonded to substrate 100 and that provides a suitable surface for the fabrication of electronic circuitry 108. Any suitable material or application process may be used, depending on the particular application.

In various embodiments, plastic film 106 may have a thickness within the range of 10 to 50 microns, though plastic film 106 may have any suitable thickness that enables the fabrication of circuitry 108 on a surface of plastic film 106 and the subsequent removal of plastic film 106 from substrate 100 (e.g., some embodiments may include plastic films 106 that are less than 10 microns thick, other embodiments may include plastic films 106 having a thickness confined to a narrower range of 18 to 50 microns, still other embodiments may include plastic films 106 having a thickness within the range of 50 to 500 microns, and particular embodiments, depending on the application, may include plastic films having a thickness of 1 mil or less). In this example, a transparent, 18 micron thick plastic film 106 is applied to the photoresist-laminated substrate 100 by running the substrate 100 through a plastic-film laminator. During this lamination act, plastic film 106 is held taut, the rollers of the laminator are heated to approximately 30 C-100 C, and adhesive layer 102 bonds plastic film 106 to the substrate 100, resulting in a smooth, plastic-laminated coating of the photoresist-laminated substrate 100.

In this example, the plastic-laminated substrate 100 is then placed in an oven and heated to a temperature that is greater than the highest temperature exposure of plastic film 106 during subsequent electrical circuitry processing. This oven process may pre-stretch and/or pre-shrink plastic film 106, thereby preconditioning plastic film 106 before subsequently forming circuitry 108. After laminating plastic film 106 to substrate 100, it may be possible to heat plastic film 106 slightly above its melting temperature without destroying the plastic film 106. The plastic-laminated substrate 100 then undergoes electrical circuitry 108 processing.

Electrical circuitry 108 generally refers to any conductive or resistive interconnects, interconnect layers, electrical components, or other structures that may be formed on a surface of plastic film 106. In various embodiments, the processing of electrical circuitry 108 may be substantially similar to standard semiconductor processing. Such electrical circuitry 108 processing may include, for example, deposition of conductive or resistive films, photolithographic patterning, etching, or any other suitable processing that may be used to form circuitry 108 on a surface of the plastic-laminated substrate 100. Although some embodiments may be scalable with current and future processing techniques, some embodiments using conventional processing techniques may include electrical circuitry 108 that is approximately 6 microns wide with approximately 8 micron spacing between elements of the electrical circuitry 108; however, any suitable dimensions and spacing may be used, including, for example, electrical circuitry 108 having widths of 10 microns or less, or electrical circuitry 108 having widths within the range of approximately 2 microns to 50 microns or greater (e.g., 100 microns, 500 microns etc.) and a spacing between electrical circuitry 108 elements of approximately 2 microns or greater (e.g., 10 microns 50 microns, 100 microns, etc.). At the completion of the electrical circuitry 108 processing, plastic film 106 is separated from substrate 100, as illustrated in FIG. 1C.

Figure 1C:
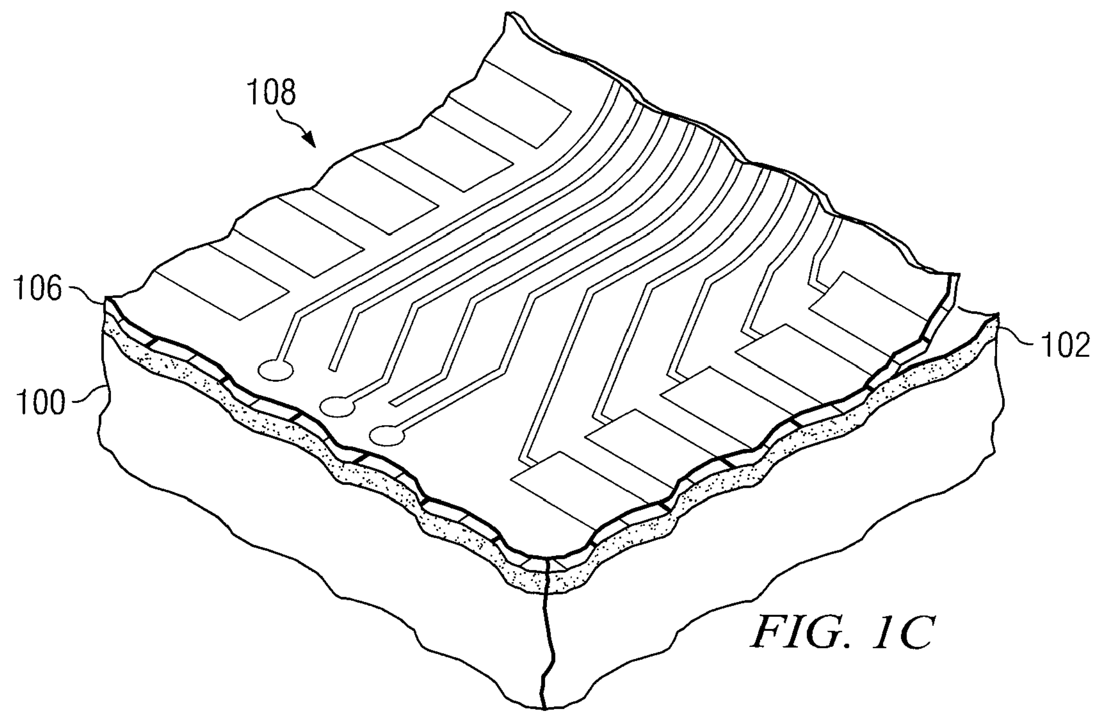
FIG. 1C shows a perspective view of a portion of the substrate of FIG. 1B during a process that removes plastic film from the substrate after the electronic circuitry has been processed on the surface of the plastic film.

FIG. 1C shows a perspective view of a portion of the substrate 100 of FIG. 1B during a process that removes plastic film 106 from substrate 100 after electronic circuitry 108 has been processed on a surface of plastic film 106. Plastic film 106 may be removed from substrate 100 using any of a variety of processes. For example, one method includes soaking the plastic-laminated substrate 100 in water for approximately an hour and then gently peeling plastic film 106 from substrate 100; however, any suitable soak or other removal technique may be used, including either mechanical or manual removal techniques. For particularly well-attached plastic films 106, the soak may alternatively or additionally include a solvent, such as, for example, acetone, to help separate plastic film 106 from substrate 100. After separation of plastic film 106 from substrate 100, a solvent clean may remove any residual dry photoresist film 102 from plastic film 106. Air drying subsequently dissipates the solvent clean. This completes the processing of the example embodiment.

Thus, according to the teachings of some embodiments of the present disclosure, complex circuits may be formed on the surface(s) of ultra-thin, flexible plastic films that have a thickness of 50 microns or less; however, as disclosed previously, plastic film may have any suitable thickness, including, for example, a thickness of approximately 1 mil. The processes of various embodiments are generally applicable to standard semiconductor fab environments. In addition, the processes described herein may still apply to future scaling advances in semiconductor interconnect processing. Some embodiments may provide multi-layer interconnects, including, for example, interconnected circuitry on both sides of a thin plastic film. In some embodiments, the circuitry formed on thin plastic films may be able to perform particular functions, such as, for example, transmitting signals. In addition, in some embodiments the electronic circuitry may be invisible to the naked eye and thus a fully processed plastic film may appear substantially transparent. Additional details regarding the processing of electronic circuitry 108 on thin-film plastics 104 or 106 are described below with reference to FIG. 2.

Figure 2:
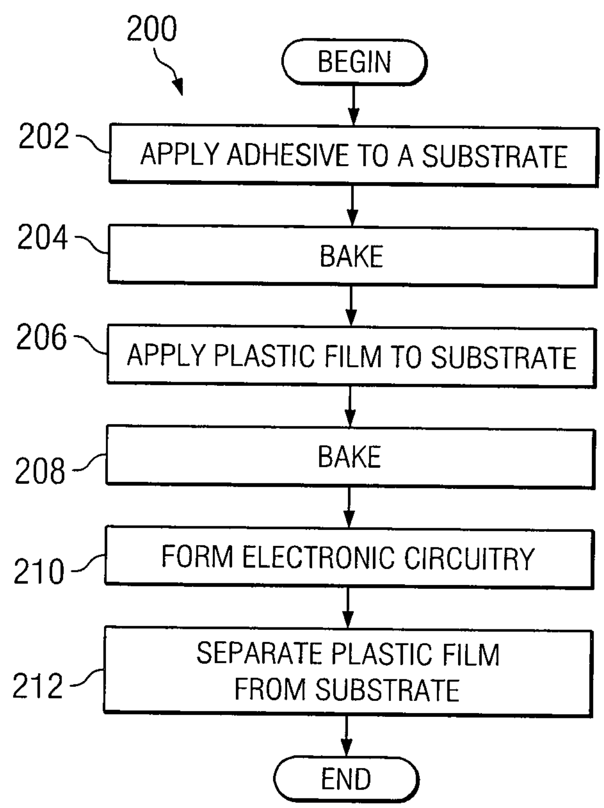
FIG. 2 is a flow chart illustrating a method of forming interconnects on thin film according to the teachings of one embodiment of the present disclosure.

FIG. 2 is a flow chart 200 illustrating one example method of forming high-density electronic circuitry on ultra-thin plastic films according to one embodiment. In general, flowchart 200 includes the following acts: (i) an ultra-thin plastic film is coupled to a substrate; (ii) high-density circuitry is micro-fabricated on a surface of the plastic film using photolithography; and (iii) the plastic film is separated from the substrate.

In act 202, an adhesive is applied to a substrate. In this example, the adhesive is a negative FX930 dry photoresist film that includes a Mylar protective cover; however, any suitable adhesive may be used. After the photoresist film is laminated to the substrate, the protective cover is removed from the photoresist film.

The photoresist-laminated substrate is then baked in act 204. The bake generally removes some of the solvents in the exposed photoresist film 102 that might otherwise outgas and warp the photoresist surface. Suitable bake parameters for this example include exposure to a temperature range of 90 C to 150 C for approximately ten minutes; however any suitable bake parameters may be used.

An ultra-thin plastic film is then applied to the substrate in act 206. In this example, a transparent and ultra-thin plastic film is applied to the photoresist-laminated substrate by running the substrate through a plastic-film laminator. During this lamination act, the plastic film is held taut, the rollers of the laminator are heated to approximately 30 C-100 C, and the photoresist film bonds the plastic film to the substrate, resulting in a smooth, plastic-laminated coating.

In act 208, the plastic-laminated substrate is then placed in an oven and heated to a temperature that is greater than the highest temperature exposure of the plastic film during the subsequent electrical circuitry processing. This oven process may pre-stretch and/or pre-shrink the plastic film, thereby preconditioning the plastic film before subsequently forming circuitry on the plastic film. After laminating the plastic film to the substrate, it may be possible to heat the plastic film slightly above its melting temperature without destroying the plastic film.

The plastic-laminated substrate then undergoes electrical circuitry processing in act 210. In this example, the electrical circuitry processing uses photolithography equipment and processing techniques substantially similar to the equipment and processing techniques used for fabricating high-density metal lines and spaces on semiconductor integrated circuits (ICs). More specifically, the electrical circuitry processing may include deposition of conductive or resistive films, patterning, etching, or any other suitable processing that may be used to form circuitry on a surface of the plastic-laminated substrate. In some embodiments, portions of the electronic circuitry, such as interconnects, may be 10 microns wide or less (e.g., 8 microns wide) depending on tool capabilities and/or particular circuit designs. In addition, such interconnects may be spaced apart from each other by 8 microns or less, for example, again depending on tool capabilities and/or particular circuit designs.

The processed plastic film is removed from the substrate in act 212 using any of a variety of processes. In this example, the plastic-laminated substrate is soaked in water for approximately an hour prior to gently peeling the plastic film from the substrate; however, any suitable soak or other removal technique may be used, including either mechanical or manual removal techniques. For particularly well-attached plastic films, the soak may alternatively or additionally include a solvent, such as, for example, acetone, to help separate the plastic film from the substrate. After separation of the plastic film from the substrate, a solvent clean may remove any residual dry photoresist film from the plastic film. Air drying may be used to subsequently dissipate the solvent clean. Flow chart 200 ends after completion of act 212.

As explained previously, various alternative embodiments may have simplified process flows. For example, embodiments that use the protective, sacrificial layer 104 of a dry photoresist film may skip acts associated with applying a second plastic film 106 to the substrate 100 using a laminator. Instead, the circuitry 108 previously described may be formed on a surface of the protective film 104 disposed outwardly from the photoresist 102.

Additionally, various alternative embodiments may have more complicated process flows. Some such embodiments may use multi-level circuitry disposed on one side or both sides of the thin plastic film. For example, disposing multi-level circuitry on a first side of the thin plastic film may be effected by alternatively forming an interconnect layer and an outwardly disposed dielectric layer using techniques substantially similar to those of standard semiconductor processes. Forming interconnects on a second side of the thin film may be effected, for example, by adhering the fully processed substrate to a second substrate. The resulting assembly may generally include the first substrate, the first adhesive, the thin film, the second adhesive, and the second substrate. Separating the first substrate and first adhesive from the assembly thus exposes the second side of the thin film for subsequent processing. At some point, the first and second sides of the thin film may be interconnected by forming vias through the thin film using any of a variety of methods. In one non-limiting example, laser ablation may form vias at predetermined locations.

Although the present disclosure has been described with several embodiments, a myriad of changes, variations, alterations, transformations, and modifications may be suggested to one skilled in the art, and it is intended that the present disclosure encompass such changes, variations, alterations, transformations, and modifications as fall within the scope of the appended claims.

What is claimed is:

1. A method of forming high-density metal interconnects on flexible, thin-film plastic, comprising:

laminating a dry photoresist layer to a substrate;

baking the photoresist-laminated substrate;

forming an assembly by laminating a plastic film to the baked, photoresist-laminated substrate;

processing one or more electrically conductive interconnects on a first surface of the laminated plastic film, the processing of the one or more electrically conductive interconnects comprising photolithography;

baking the assembly;

soaking the assembly in a liquid; and separating the processed plastic film from the substrate.

2. The method of claim 1, wherein the plastic film is substantially transparent.

3. The method of claim 1, wherein the plastic film has a positive thickness of 50 microns or less.

4. The method of claim 1, wherein:

the processed one or more electrically conductive interconnects each has a positive width of 10 microns wide or less; and at least two of the processed one or more electrically conductive interconnects are spaced apart from each other by a gap defined by a positive distance that is 8 microns wide or less.

5. A method of forming high-density electronic circuitry on thin-film plastic, comprising:

coupling a plastic film to a photoresist layer disposed outwardly from a first substrate;

forming, using photolithography, one or more electrically conductive interconnects on a first surface of the plastic film; and separating the plastic film from the first substrate and the photoresist layer.

6. The method of claim 5, further comprising:

laminating the photoresist layer to the first substrate;

baking the photoresist-laminated first substrate; and wherein coupling the plastic film to the photoresist layer disposed outwardly from the first substrate further comprises using the laminated photoresist layer to adhere the plastic film to the first substrate.

7. The method of claim 5, wherein coupling the plastic film to the photoresist layer disposed outwardly from the first substrate further comprises laminating the plastic film to the photoresist layer.

8. The method of claim 5, wherein the plastic film has a positive thickness that is less than 1 mil.

9. The method of claim 5, wherein the plastic film is substantially transparent.

10. The method of claim 5, wherein at least one of the plurality of electrically conductive interconnects has a positive width that is 10 microns or less.

11. The method of claim 5, wherein respective portions of at least two of the plurality of electrically conductive interconnects are spaced apart from each other a positive distance that is 8 microns or less.

12. The method of claim 5, further comprising baking the first substrate after coupling the plastic film to the first substrate.

13. The method of claim 5, wherein separating the plastic film from the first substrate further comprises soaking the first substrate in a liquid.

14. The method of claim 5, further comprising forming one or more electrically conductive interconnects on each of a plurality of layers disposed outwardly from the first surface of the plastic film.

15. The method of claim 5, further comprising:

coupling a second substrate to the first substrate, the coupled first and second substrates forming an assembly;

exposing a second surface of the plastic film by separating the first substrate from the assembly; and forming electrically conductive interconnects on the exposed second surface of the plastic film.

16. The method of claim 15, further comprising forming conductive vias through the plastic film.

17. The method of claim 16, wherein forming the conductive vias through the plastic film further comprises laser ablating a portion of the plastic film.

* * * * *